Oct. 17, 1967 J. R. A. BEALE ETAL Re. 26,282

METHOD OF MAKING SEMICONDUCTOR DEVICE

Original Filed July 22, 1959

INVENTORS
JULIAN R.A. BEALE
BY ANDREW F. BEER
Frank R. Trifari
AGENT

United States Patent Office

Re. 26,282
Reissued Oct. 17, 1967

26,282
METHOD OF MAKING SEMICONDUCTOR DEVICE

Julian Robert Anthony Beale and Andrew Francis Beer, by North American Philips Company, Inc., assignee Original No. 2,980,983, dated Apr. 25, 1961, Ser. No. 828,777, July 22, 1959. Application for reissue Mar. 10, 1967, Ser. No. 628,172
Claims priority, application Great Britain, July 29, 1958, 24,404/58
6 Claims. (Cl. 29—583)

Matter enclosed in heavy brackets [ ] appears in the original patent but forms no part of this reissue specification; matter printed in italics indicates the additions made by reissue.

*ABSTRACT OF THE DISCLOSURE*

*A method of providing electrical connections to a semiconductor device by providing a common electrical connection between spaced conductive projections of the semiconductor body and thereafter severing the intervening conductive part to obtain extensions of the common conductor as separate current supply conductors for each of the conductive projections.*

Figure 1:
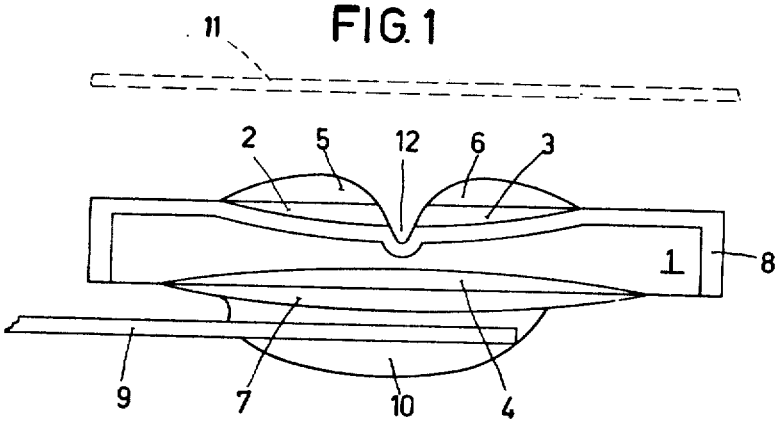

The present invention relates to methods of providing electrical connections to semi-conductor devices.

It is often desired to make separate connections to a plurality of parts of a semi-conductor device which parts are associated with projections projecting above the surrounding surface of the device. Such a projection may be provided in the manufacture of the device by removal of material, for example by etching, or by addition of material, for example in alloying to form an alloy junction.

In making an alloy junction, a semi-conductor single-crystal body is taken and material, usually a predominantly donor or a predominantly acceptor material, is either placed on the crystal and heated so that alloying occurs or is brought into contact with the crystal in the molten state so that alloying occurs, in either case the part of the crystal adjacent the donor or acceptor material dissolves. On cooling, most of the liquid original crystal material recrystallises as part of the single crystal to form an alloy zone and, projecting beyond the recrystallised material and the unaltered part of the single crystal mass, the main part of the usually predominantly donor or predominantly acceptor material resolidifies. A junction, termed an alloy junction, is formed at, or just beyond, the limit of the recrystallised material between the recrystallised material and the unmelted part of the single-crystal mass. The junction may be between a p-zone and an n-zone, between a p-zone and a p-zone of different conductivity, between an n-zone and an n-zone of different conductivity or between two zones of like conductivity and conductivity type but of different composition.

According to the present invention, a method of providing electrical connections to a pair of projections on a semi-conductor body comprises the steps of providing electrical connection between the two projections and a common conductor and thereafter severing the conductor between the two projections to provide separate connection to each projection.

The common conductor may be of a material capable of forming an alloy with the material of the projections and be provided across and in contact with the projections whereafter heating and cooling are carried out to provide alloyed connections between the common conductor and the projections.

As an alternative, an insulating layer may be provided on the surface of the mass around the projections, at least a part of the surface of each projection being free of the insulating layer, and a conductive layer constituting the common conductor is applied on the insulating layer and on the free surface of the projections.

Each projection may be associated with an alloy zone and an alloy junction. The inventive technique is especially suitable for making current-supply connections to projections or contacts on a semiconductor body, which projections are spaced apart by a very small distance such as 100 microns or less.

The conductor may be in filamentary form and be held across and in contact with the projections during the heating and cooling steps. The heating and holding may be such that there is no substantial alternation of the alloy junctions. This means that the temperature should not be so high nor the heating continued for so long that significantly deeper alloying or significant further diffusion takes place; further the effect of the holding should not be that the molten material is significantly spread over the surface of the semi-conductor body.

The conditions may readily be determined experimentally for any particular case.

Two ways in which the holding may be effected are as follows:

The conductor may be held under tension between two clamps so that it is held from its equilibrium position by the projections. On heating being effected, the conductor will move to its equilibrium position, the extent of movement being thus predetermined.

The conductor may be held in contact with the projections and moved positively towards the semi-conductor body through a predetermined distance during the heating step. Thus the conductor may be wrapped around a support which is urged in the direction towards the semi-conductor body and limited in its possible travel by a stop.

The invention also relates to a method of manufacturing a transistor, comprising the steps of providing an alloy zone by alloying a predominantly donor or a predominantly acceptor material to a p-type or n-type semi-conductor single-crystal body respectively providing a narrow channel in the resolidified material, applying a predominantly donor or a predominantly acceptor material respectively to the resolidified material at one side of the channel and heating to alloy again so that the conductivity of the newly recrystallised semi-conductor material remains unchanged on one side of the channel and is reversed on the other side of the channel so that two junctions are provided, one being either an n-n or p-p junction and the other being a p-n junction, whereafter connection is provided to the two alloy zones by the method according to the present invention. As a modification, the p-p or n-n junction and the p-n junction may be provided by a method comprising the steps of providing a single alloy zone by alloying a neutral material to a p-type or n-type semi-conductor single-crystal mass, providing a narrow channel in the resolidified material, applying a predominantly donor material or a predominantly acceptor material to the resolidified material at one side of the channel and a predominantly acceptor material or a predominantly donor material, respectively, to the resolidified material at the other side of the channel and heating to alloy again so that the two junctions are provided. The term "neutral material" means a material having no significant donor or acceptor characteristics. An example of such a material is lead.

The channel may be made by mechanical means and the severing effected thereafter with the use of the same or a similar mechanical means.

A plurality of pairs of projections may be provided on a semi-conductor single-crystal body, the pairs being so arranged that an imaginary straight line may be drawn extending between the projections of each pair, a length of conductor held across and in contact with each of each pair of projections, the longitudinal directions of the conductors being transverse to the imaginary line, and severing effected by a severing tool extending and/or traversed along the imaginary line.

Figure 2:
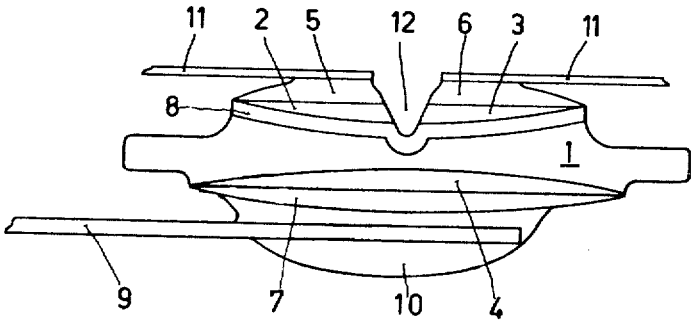
Figure 3:
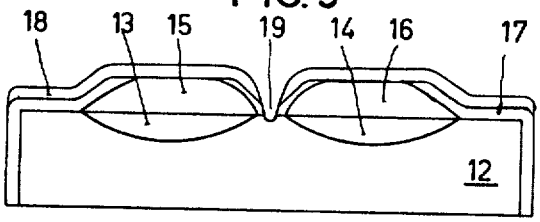

Two embodiments of methods according to the present invention will now be described, by way of example with reference to the accompanying diagrammatic drawings in which:

FIGURES 1 and 2 are cross-sectional views of a transistor at two stages in the manufacture, the cross-sectional views not being shaded since such shading would not enhance the clarity of the figures; and FIGURE 3 is a cross-sectional view of a second embodiment at an intermediate stage of manufacture.

The stage shown in FIGURE 1 is reached in the following manner.

A rectangular single-crystal slice of 2 ohm/cm. p-type germanium is taken and pellet is lightly alloyed to it. The slice dimensions are about 2 mm. x 2 mm. x 6 thousandths of an inch. The pellet has the shape of a sphere about 7 thousandths of an inch diameter and is made of bismuth with 2% by weight of arsenic. Alloying is effected by placing the pellet about centrally on one of the two larger surfaces of the slice and the whole is then heated in an atmosphere of hydrogen to about 650° C. for about 3 minutes.

The unchanged p-type region of the crystal has recrystallised on it an n-type region due to solution of bismuth and arsenic in the originally p-type germanium. The n-type region is covered by a layer consisting mainly of resolidified arsenic and bismuth and including a little germanium. The transverse dimension of the resolidified bismuth and arsenic is about 8 thousandths of an inch. During the heating step, there is diffusion along the solid surface of the crystal slice and diffusion both from the surface of the crystal slice and from the liquid into the otherwise unchanged part of the crystal slice. The diffusion depth will however be small.

A thin slot is then made diametrically of the resolidified and recrystallised layer extending into the unchanged part of the crystal slice. The slot is made by ultrasonic cutting using a thin cutting head and a slurry of fine aluminum oxide abrasive. The slot is about 1 thousandth of an inch wide at its bottom and is slightly V-shaped due to abrasion of the sides of the existing slot as the cutting operation proceeds further.

The whole is then placed in an etching bath of 20 volumes hydrogen peroxide at 70° C. for about 15 minutes. This etch removes about 0.2 thousandth of an inch from the surface of the germanium and thus removes from the slot material which is damaged by the ultrasonic cutting operation. This etch incidentally at least substantially removes the surface n-type layer formed by diffusion of arsenic along and from the solid surface of the region 1.

The slot divides the p-n junction substantially into halves.

Aluminum is deposited on the surface of the right hand side of the divided resolidified layer.

The whole is then heated in an atmosphere of hydrogen for about 10 minutes at 750° C. Alloying again takes place and this time at a temperature sufficiently high to ensure that a little more of the germanium slice dissolves than in the first heating step. The left-hand side of the newly recrystallised layer on solidification is n-type but the right hand side of the newly recrystallised layer is p-type due to the higher solubility of the acceptor impurity aluminum reversing the initial effect of the donor-impurities bismuth and arsenic. The layer above the newly recrystallised layer at the right hand side consists of aluminum, arsenic and bismuth together with a small content of germanium.

In addition to the alloying, there is also diffusion; bismuth and arsenic diffuse from both the right-hand and left-hand parts and aluminum from the right-hand part. As a result of this diffusion, the p-n junction (not shown) lies a little below the furthest penetration of the liquid-solid interface of the recrystallised region and in addition there is surface diffusion. The diffusion during this second heating step, which is carried out at a higher temperature and for a longer time than the first heating step, produces a deeper diffused region than that produced by the first heating step. During this second heating step it is found that liquid does not flow appreciably into the slot. It is not necessary to alloy deeper into the slice at the second heating step than at the first heating step but if this is done the base width of the transistor produced by the diffusion is substantially independent of the depth of alloying, that is diffusion substantially takes place from the liquid-solid interfaces produced in the second heating step.

The depth of the slot is made sufficient to ensure that the p-type and n-type liquids on either side of the slot do not run together.

The upper part of the product, in the position shown in FIGURE 1, is then provided with a covering of polystyrene lacquer, applied as a solution in ethylmethylketone and the whole is immersed in an etchant consisting of 1 part by volume of 40% hydrofluoric acid, 1 part by volume of 20 vols. hydrogen peroxide and 4 parts by volume of distilled water until the diffused layer at the part of the crystal opposite that to which the pellet is alloyed is etched away. The lacquer is then removed by immersing the whole in a bath of ethylmethylketone.

A collector is then provided by placing a disc of indium with 1% by weight of gallium on the lower surface of the etched slice, in the position shown in FIGURE 1. The collector is alloyed-on by heating in an atmosphere of hydrogen at about 500° C. for about 5 minutes. Little further diffusion takes place at this comparatively low temperature. The position of the collector is not critical. A stout nickel wire 9, which acts as an electrical connection and as a support, is soldered to the resolidified indium and gallium using indium solder and a small soldering iron.

In FIGURE 1, the unchanged p-type part 1 of the crystal slice has three alloy layers 2, 3 and 4 recrystallised on it. The upper left-hand recrystallised layer 2 is n-type, the upper right-hand recrystallised layer 3 is p-type and the lower recrystallised layer is also p-type. The upper left-hand resolidified layer 5 is of bismuth and arsenic with a little germanium, the upper right-hand resolidified layer 6 is of bismuth, arsenic and aluminum with a little germanium and the lower resolidified layer 7 is of indium and gallium with a little germanium. The diffused layer 8 is n-type due to the fact that arsenic diffuses more rapidly than aluminum. The nickel wire 9 is soldered to the layer 7 with indium solder 10.

A length of conductor in the form of a strip 11 of silver, shown in FIGURE 1 in broken lines, six thousandths of an inch wide and one thousandth of an inch thick held under tension between two holders (not shown) is arranged above the crystal 1 and the holders are moved towards the crystal 1 until contact with a light pressure is made between the strip 11 and the top parts of the layers 5 and 6.

The whole is then heated to about 330° C. for 2 to 5 minutes in an atmosphere of hydrogen during which time the layers 5 and 6 again become liquid and on solidification the silver strip is alloyed to the layers 5 and 6. The strip 11 at the layers 5 and 6 moves through a distance of 2 thousandths of an inch when the layers 5 and 6 become liquid. The deformation of the layers 5 and 6 is small and insufficient to cause appreciable sideways spread of the layers 5 and 6 and since also the heating temperature is low, there is no substantial alteration of the alloy junctions.

The part of the strip 11 between the two areas of attachment by soldering to the layers 5 and 6 respectively is then severed using a razor blade similar in dimensions to the thin ultarsonic cutting head.

Instead of using two holders for the strip 11, the strip may be wrapped round a solid former and placed in contact with the layers 5 and 6. The former may be spring-urged in the direction of the crystal slice and a stop provided to limit its travel to the desired distance in that direction.

In order to assist in preventing flow of the liquid across the channel 12, the channel may be filled with alumina cement before the soldering is effected and the channel 12 may remain protected by the cement during the severing operation. The cement is removed by brushing with a brush wetted with water.

With the channel 12 protected by allowing a drop of dilute polystyrene lacquier, dissolved in ethylmethylketone, to fall into the channel 12 the three conductors 9, 10 and 11 are then connected to the positive terminal of a voltage source and the device immersed in an electrolytic etching bath containing a 5% aqueous solution of sodium hydroxide. A platinum electrode is provided in the bath and is connected to the negative terminal of the voltage source. A current of 10 ma. is allowed to flow for about 10 minutes so that more than 1 thousandth of an inch thickness is etched off and it will be noted from FIGURE 2 that there is a degree of undercutting and that the etching removes the surface part of the n-type layer 8.

The lacquer is then removed from the channel 12 and the whole is immersed in an etching bath of 20 volumes hydrogen peroxide at 70° C. for about15 seconds. The transistor is then washed, dried and thereafter encapsulated in any known manner.

The silver strips 11 may be connected directly or indirectly to a lead-through pin or wire.

The final but unencapsulated transistor is shown in FIGURE 2.

In FIGURE 3, a single crystal slice 12 of n-type germanium has two n-type zones 13 and 14 produced by alloying pellets of indium to the upper surface of the slice. The upper surface and the projections 15 and 16 are then provided with an insulating layer 17 of polystyrene lacquer, applied as a solution in ethylmethylketone, and the lacquer is removed from the upper parts of the projections either by mechanical means or by rubbing with a solvent; as shown mechanical means effecting a planing action have been used and material has also been removed from the tops of the projections. A layer of silver 18 is then applied, for example, by evaporation in vacuo. The layer 18 is thereafter divided at 19 by ultrasonic cutting using a thin cutting head and a slurry of fine aluminum oxide abrasive, to provide separate connection to each projection.

It will be clear that another conductor metal may be used instead of silver. Thus for instance copper may be used as the conductor metal for an electrode consisting mainly of lead or bismuth, and copper and gold may be used as the conductor metal to an indium electrode.

The embodiments described above may be modified for use in any method of manufacturing a semi-conductor device. Thus the method described with reference to FIGURES 1 and 2 or FIGURE 3 may be used to provide connections to adjacent projections of a field-effect transistor associated with electrodes of the same conductivity type.

What is claimed is:

1. A method for the manufacture of a semi-conductor device comprising a semi-conductive body having two adjacent, spaced, conductive projections, comprising the steps of connecting a common conductor of a length substantially greater than the spacing between the said projections to and across the said projections such that the common conductor forms a connecting part between said projections and forms extensions over a substantial length beyond each of said projections, and thereafter severing the connecting part of the common conductor between said projections to obtain the said extensions of said common conductor as separate current supply conductors for each of said projections.

2. A method for the manufacture of a semi-conductor device comprising a semi-conductive body having two tiny, closely-adjacent, spaced, metallic projections, comprising the steps of alloying a common metal filamentary conductor of a length substantially greater than the spacing between the said projections to and across the said projections such that the common conductor forms a connecting part between said projections and forms extensions over a substantial length beyond each of said projections, and thereafter severing the connecting part of the common conductor between said projections to obtain said extensions of said common conductor as separate current supply conductors for each of said projections.

3. A method for the manufacture of a semi-conductor device comprising alloying an impurity-bearing electrode-forming mass to a single crystal semiconductive body to form a large-area junction, cutting a narrow channel completely through the mass and into the semiconductive body to form separate masses, adding an impurity to only one of the said separate masses, refusing the masses to incorporate into said one mass the added impurity and modify the conductivity of an adjacent body region, and providing supply conductors to the separate masses by fusing a common conductor of a length substantially greater than the spacing between the said masses to and across the said masses such that the common conductor forms a connecting part between said masses and forms extensions over a substantial length beyond each of said masses and thereafter cutting the connecting part of the common conductor between said masses to obtain said extensions of said common conductor as separate current supply conductors for each of said masses.

4. *A method for the manufacture of a semiconductor device comprising a semiconductive body having on a surface two adjacent, spaced, conductive projections and also on the surface a layer of insulating material having openings over the conductive projections thereby exposing the surfaces of the latter, comprising the steps of providing on the insulating layer a conductive layer of a length substantially greater than the spacing between the said projections to and across the said projections and in contact with its exposed surfaces such that the common conductive layer forms a connecting part between said projections and forms extensions over a substantial length beyond each of said projections, and thereafter severing and removing the connecting part of the common conductive layer between said projections to obtain the said extensions of said common conductive layer as separate current supply conductors for each of said projections.*

5. *A method for the manufacture of a semiconductor device comprising a semiconductive body having on a surface two adjacent, spaced, conductive projections, comprising the steps of providing on the said surface over the body and over the projections a layer of insulating material, forming openings in the insulating layer over the projections thereby exposing the surfaces of the latter, depositing on the insulating layer a conductive layer of a length substantially greater than the spacing between the said projections to and across the said projections and in contact with its exposed surfaces such that the common*

*conductive layer forms a connecting part between said projections and forms extensions over a substantial length beyond each of said projections, and thereafter severing and removing the connecting part of the common conductive layer between the said projections to obtain the said extensions of said common conductive layer as separate current supply conductors for each of said projections.*

6. *A method as set forth in claim* 5 *wherein the conductive layer is deposited by vacuum evaporation.*

References Cited

The following references, cited by the Examiner, are of record in the patented file of this patent or the original patent.

UNITED STATES PATENTS 2,840,885 7/1958 Cressell.

WILLIAM I. BROOKS, *Primary Examiner.*